United States Patent
Strack et al.

(10) Patent No.: US 6,248,620 B1
(45) Date of Patent: Jun. 19, 2001

(54) METHOD FOR FABRICATING A FIELD EFFECT-CONTROLLED SEMICONDUCTOR COMPONENT

(75) Inventors: Helmut Strack, München (DE); Helmut Gassel, Farmington Hills, MI (US); Joost Larik, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/491,095

(22) Filed: Jan. 24, 2000

Related U.S. Application Data

(63) Continuation of application No. PCT/DE98/02022, filed on Jul. 17, 1998.

(30) Foreign Application Priority Data

Jul. 22, 1997 (DE) .............................................. 197 31 496

(51) Int. Cl.$^7$ .............................................. H01L 21/8238
(52) U.S. Cl. .............................................. 438/226
(58) Field of Search .............................. 438/268, 197, 438/199–211, 226, 800

(56) References Cited

U.S. PATENT DOCUMENTS

| | | | |
|---|---|---|---|
| 4,960,723 | 10/1990 | Davies . | |
| 5,034,791 | * 7/1991 | Kameyama et al. | 357/23.9 |
| 5,202,276 | 4/1993 | Malhi . | |
| 5,202,277 | 4/1993 | Kameyama et al. . | |

FOREIGN PATENT DOCUMENTS

| | | |
|---|---|---|
| 0439173A2 | 7/1991 | (EP) . |
| 0460251A1 | 12/1991 | (EP) . |
| 0658940A1 | 6/1995 | (EP) . |
| 62-8567 | 1/1987 | (JP) . |

OTHER PUBLICATIONS

"A Self–Aligned Inverse–T Gate Fully Overlapped LDD Device for Sub–Half Micron CMOS", D.S. Wen et al., IEDM 89, pp. 765–768.

"Higher cell density, more rugged design", Heinz Amann et al., Components Feb. 1997, pp. 11–13.

* cited by examiner

Primary Examiner—Charles Bowers
Assistant Examiner—Craig Thompson
(74) Attorney, Agent, or Firm—Herbert L. Lerner; Laurence A. Greenberg; Werner H. Stemer

(57) ABSTRACT

A method for fabricating field effect-controlled semiconductor components, such as e.g. but not exclusively MIS power transistors. The field effect-controllable semiconductor component has a semiconductor substrate of a first conductivity type and a gate insulator layer on the surface of the semiconductor substrate. A well of a second conductivity type is produced in the semiconductor substrate by implanting first impurity atoms. A semiconductor layer having a first predetermined thickness is produced on the gate insulator layer prior to the production of the well. The semiconductor layer is reduced in a predtdermined region to obtain a residual layer having a second predetermined thickness, such that the semiconductor layer acts as an implantation barrier outside the predetermined region when the well is produced.

10 Claims, 1 Drawing Sheet

METHOD FOR FABRICATING A FIELD EFFECT-CONTROLLED SEMICONDUCTOR COMPONENT

CROSS-REFERENCE TO RELATED APPLICATION

This is a continuation of copending International Application PCT/DE98/02022, filed Jul. 17, 1998, which designated the United States.

BACKGROUND OF THE INVENTION

Field of the Invention

The invention relates to a method for fabricating field effect-controlled semiconductor components, such as e.g. but not exclusively MIS power transistors. Such semiconductor components contain a semiconductor substrate of a first conductivity type that is covered by a gate insulator layer. The essential method steps exhibited by the known methods are the production of a well of a second conductivity type in the semiconductor substrate and the production of a contact region of the first conductivity type in the well.

The smallest possible on resistances are striven for when fabricating MIS power transistors. On resistances of less than 3 mΩ (in the TO220 housing) have already been achieved for planar MIS power transistors having reverse voltages of up to 100V. The channel resistance, the JFET resistance and the epitaxial resistance, i.e. the resistance of the semiconductor substrate through which the current flows after the channel to the drain terminal, each make up approximately one third of the on resistance. Since the epitaxial resistance cannot be influenced very much, it is necessary to reduce the channel resistance and the JFET resistance in order to reduce the on resistance.

In addition to reducing the on resistance, a high cell density and therefore a small cell size are striven for for components for high switching capacities. "Self-aligning" techniques are used nowadays for this purpose during the fabrication of the component. In this case, heavily doped polysilicon is used as the gate material and as a mask for the doping of source and drain. The gate serves as a mask for the doping, and the source and drain terminate exactly under the edge of the gate.

The actual fabrication of the cell with a small size is then carried out according to one of three techniques essentially used nowadays. In the first technique, a self-aligned channel is fabricated by diffusion after implantation via the edge of the polysilicon gate and an aligned contact hole is then produced on the semiconductor. The corresponding transistors are known as DMOS or DIMOS and SIPMOS transistors.

Since the threshold voltage, channel length and penetration depth mutually influence one another, however, in the case of the diffusion MOS transistors, the parameters cannot be optimized individually. In addition, the charge carrier concentration decreases in the channel between the source and the drain in the transistors fabricated by diffusion. However, the maximum concentration of the charge carriers (at the source) determines, for its part, the threshold voltage of the transistor, with the result that the channel length cannot be reduced to significantly below 1 μm.

In a second technique, a double diffused (DMOS) FET is fabricated and a self-aligned contact hole is provided with the aid of the known "spacer" technology. The self-aligned contact hole fabricated using spacer technology enables the spacing of the contact hole from the gate to be reduced to approximately 0.5 μm without a high requirement being made on the alignment. This results in a geometrical length from the contact hole up to the end of the channel at the drain of approximately 1.5 μm.

A further reduction in the channel length to below 1 μm is not possible using this method.

Finally, in a third method according to the prior art, the channel and the contact hole are produced by traditional methods (without self-alignment) by aligning the corresponding masks with one another.

SUMMARY OF THE INVENTION

It is accordingly an object of the invention to provide a method for fabricating a field effect-controlled semiconductor component which overcomes the above-mentioned disadvantages of the prior art methods of this general type, in which a field effect-controllable semiconductor component is fabricated with the smallest possible on resistance which can be implemented in a technically simple and cost-effective manner.

With the foregoing and other objects in view there is provided, in accordance with the invention, a method for fabricating a field effect-controllable semiconductor component, which includes:

providing a semiconductor substrate of a first conductivity type having a surface;

producing a gate insulator layer on the surface of the semiconductor substrate;

producing a semiconductor layer having a first predetermined thickness on the gate insulator layer;

reducing the semiconductor layer in a predetermined region to obtain a residual layer having a second predetermined thickness; and producing a well of a second conductivity type in the semiconductor substrate by implanting impurity atoms with the semiconductor layer acting as an implantation barrier outside a predetermined region during the producing step of the well.

The production of a semiconductor layer having a relatively large thickness on the insulator layer serves as an implantation barrier outside the predetermined region when the well of a second conductivity type is produced in the semiconductor substrate by the implantation of first impurity atoms. The "superfluous" portion of the semiconductor layer is removed within the predetermined region. As a result of the smaller thickness of the semiconductor layer in the predetermined region, the depth of the well in the semiconductor substrate can be set precisely during implantation. The edge of the well can also be precisely defined by this method; no impurity atoms penetrate the semiconductor substrate below the relatively thick semiconductor layer above the substrate outside the predetermined region. In this way, it is possible to fabricate shallow and sharply delimited wells in the semiconductor substrate. On account of the small depth of the well, the channel length can be set to be smaller, with the result that the channel resistance decreases. Moreover, two adjacent cells can be disposed nearer to one another. The resistance of the JFET between two adjacent cells is reduced.

Preferably, in the method according to the invention, in order to produce the semiconductor layer on the gate insulator layer, a first semiconductor layer is produced on the gate insulator layer, an intermediate insulator layer is produced on at least a portion of the first semiconductor layer, a second semiconductor layer is produced on the intermediate insulator layer, with the result that the second semiconductor layer is partly in contact with the first semiconductor layer, and the first semiconductor layer corresponds to the residual layer in the predetermined region.

In a further preferred embodiment of the method, before the production of the contact region, a first spacer is produced as an implantation barrier on the residual layer, with the result that the spacing of the contact region from the edge of the well is predetermined. The width of the spacer enables the length of the conductive channel of the semiconductor component to be set precisely.

Preferably, after the production of the contact region, a second spacer is additionally produced as an etching barrier on the semiconductor substrate. As a result, the spacing of the contact hole from the edge of the well can also be predetermined and the extent of the contact region, i.e. of the source zone, can thus be set precisely.

One advantage of the invention is that with the reduction in the channel resistance by way of the shortening of the channel length, the cell spacing in the component can also be reduced and a power element is thus created which has smaller dimensions of the individual cells and hence a higher cell density. As a result, more cells can be fabricated on the same area and be connected in parallel, which leads to a further reduction in the on resistance.

Other features which are considered as characteristic for the invention are set forth in the appended claims.

Although the invention is illustrated and described herein as embodied in a method for fabricating a field effect-controlled semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
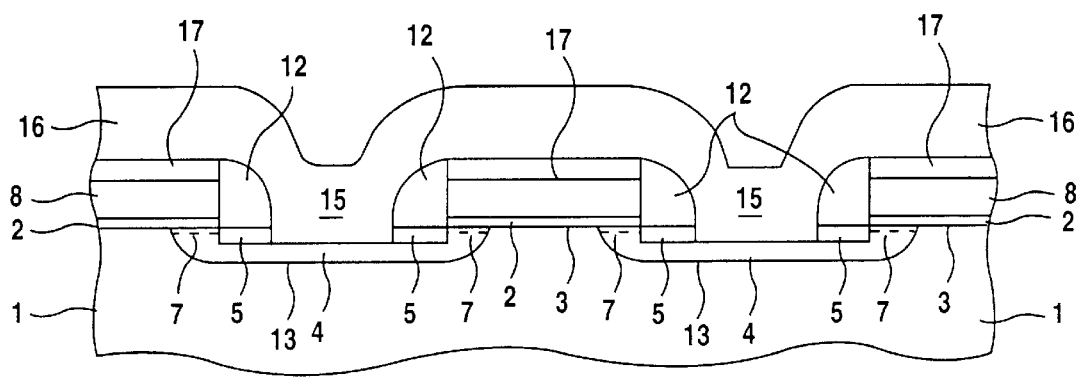
FIG. 3 is a fragmented, sectional view of part of a field effect-controlled cell according to the prior art.

In all the figures of the drawing, sub-features and integral parts that correspond to one another bear the same reference symbol in each case. Referring now to the figures of the drawing in detail and first to FIG. 3 thereof, there is shown a semiconductor component fabricated according to the prior art. In the semiconductor component shown here with two cells, a body or a well 4 is diffused into a semiconductor substrate 1 for each cell. Whereas the semiconductor substrate 1 is of a first conductivity type, e.g. n-type, the well 4 is of an opposite, second conductivity type, e.g. p-type. A depth of the well 4 in the semiconductor base substrate 1 is usually approximately 2 $\mu$m in semiconductor structures according to the prior art.

A source zone 5 is diffused into the well 4, charge carriers passing via the source zone 5 as a contact region 5 into the semiconductor cell. The charge carriers flow away out of the semiconductor component via a drain contact (not illustrated). The contact region 5 is of the same conductivity type as the semiconductor substrate 1, e.g. n-type, but has a different doping level than the semiconductor substrate 1, that is to say e.g. $n^+$-type. Situated on the semiconductor substrate 1 is a gate insulator layer 2 and on top of that, as a gate electrode, a conductive layer 8 (polysilicon), which, for its part, is insulated by a further covering insulator layer 17 from a metallization layer 16. The contact region 5 is fabricated with a spacer 12 and has a width of approximately 0.5 $\mu$m. As a result, a length of a channel 7, i.e. the shortest distance between one end of the contact region 5 and an edge 13 of the well 4 at a surface 3 of the semiconductor substrate 1, is approximately 1.5 $\mu$m. The channel 7 is illustrated by dashes in FIG. 3.

A contact hole 15 is cut out at a base of the "spacers" for the purpose of establishing electrical contact with the source zone 5. A topmost layer being the metallization layer 16 is deposited as an electrical contact coating on the semiconductor component, Al usually being used as the material for the metallization layer 16.

The method for fabricating the traditional cell (not self-aligned) according to the prior art enables the threshold voltage and the penetration depth of the well to be set separately. Depletion-mode and p-channel transistors can be fabricated simply in this way. However, it is not possible to reduce the size of the cell further using conventional techniques; for this purpose the much more complicated sub$\mu$ technique would have to be used.

Figure 1:
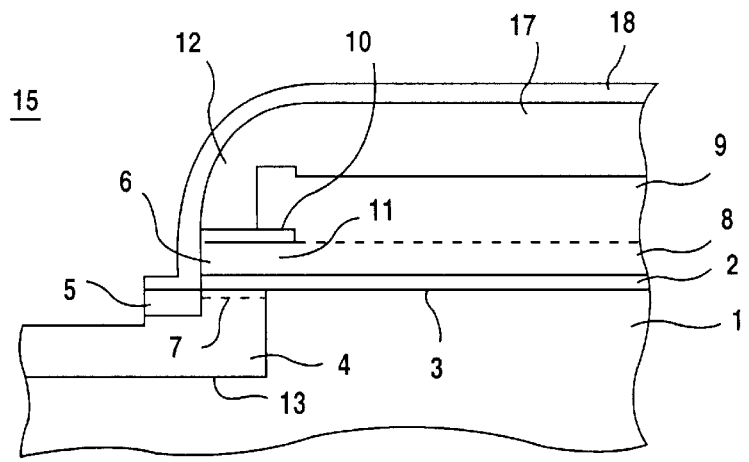
FIG. 1 is a diagrammatically, fragmented, sectional view of a first embodiment of a semiconductor component according to the invention.

The semiconductor structure according to the invention shown in FIG. 1 has the semiconductor substrate 1, which, as a rule, is an epitaxial layer on a wafer (not shown). The gate insulator layer 2 is situated on the semiconductor substrate 1. The gate insulator layer 2 is an oxide layer 2 in the case of MOS field-effect transistors. Situated on the oxide layer 2 is the conductive layer 8 being a first semiconductor layer 8, which serves as the gate electrode for the semiconductor component. The first semiconductor layer 8 is preferably a polysilicon layer. It has a thickness of only approximately 0.1 $\mu$m according to the invention, in contrast to the prior art, where this layer generally has a thickness of approximately 0.5 $\mu$m. The first semiconductor layer 8 serves as the gate electrode in the completed semiconductor component and is therefore correspondingly doped so that it has a conductivity of the desired type.

An intermediate insulator layer 10 is applied to the first semiconductor layer 8. By a (noncritical) photographic technique, the intermediate insulator layer 10 is etched away in the region between the cells. The intermediate insulator layer 10 covers a portion 11 of the first semiconductor layer 8. This portion 11 essentially corresponds to a predetermined region in which the well 4 is implanted and the contact hole 15 is provided. The intermediate insulator layer 10 serves as an etching stop for the processing of a further, second semiconductor layer 9, which is deposited on the first semiconductor layer 8 and the intermediate insulator layer 10. In a preferred embodiment of the transistor, the intermediate insulator layer 10 is an oxide layer, which can be fabricated in a simple manner by oxidizing the first polysilicon layer 8. It has a thickness of approximately 0.05 $\mu$m in the embodiment of the semiconductor component illustrated. The interface between the two semiconductor layers 8 and 9 is illustrated by dashes in FIGS. 1 and 2. By virtue of the second semiconductor layer 9, the semiconductor layer on the gate insulator layer 2 acquires essentially the same thickness of approximately 0.5 $\mu$m as in the case of the prior art.

In order to produce the well 4 in the semiconductor substrate or the epitaxial layer 1, impurity atoms are implanted into the semiconductor substrate 1 in the region 11 of the subsequent contact hole. For this purpose, a window is opened in the second semiconductor layer 9 by phototechnology. The etching process for removing the second semiconductor layer 9 ends at the intermediate insulator layer 10. Consequently, the gate insulator layer 2, the first semiconductor layer 8 and the intermediate insulator layer 10 remain on the semiconductor substrate 1. The first semiconductor layer 8 constitutes a residual layer 6, whose thickness critically influences a penetration depth of the impurity atoms into the semiconductor substrate.

A portion of the predetermined region 11 is implanted with impurity atoms through the intermediate insulator layer 10, the first semiconductor layer 8 and the gate insulator layer 2, with the result that the impurity atoms penetrate into the semiconductor substrate 1 to a depth which is defined by the thickness of the layers lying above it and the energy of the impurity atoms. Outside this portion of the predetermined region 11 in which the total thickness of the layer lying above the semiconductor substrate 1 has been reduced, the second semiconductor layer 9 acts as an implantation barrier: the doped well 4 in the semiconductor substrate 1 terminates precisely below the edge of the second semiconductor layer 9. The well 4 produced in this way is not outdiffused, but rather just annealed by relatively low temperatures or by rapid thermal annealing. The method according to the invention thus enables a sharp edge of the well 4 to be fabricated, resulting in a sharply defined end of the channel 7. In addition, the penetration depth of the implanted layer is thus considerably less than in the case of diffusion (DMOS). In contrast to the diffused profile of the DMOS configuration, a "box profile" is established in the channel region with an implantation depth of e.g. 0.5 $\mu$m.

In order to fabricate the channel 7 having a defined length between the contact region 5 and the semiconductor substrate 1, the contact region 5 must also have a specific spacing from an edge 13 of the well 4. In one embodiment of the invention, the spacing is set by the spacer 12. The spacer 12 serves as a mask during the etching of the semiconductor layer 8.

The spacer 12 can be fabricated in the known manner by depositing a further oxide (not shown) and anisotropically etching it back, the first polysilicon serving as an etching stop. Highly selective etching of the first polysilicon layer 8 removes this layer down to the gate insulator layer 2. The width of the spacer is between approximately 0.3 and 0.5 $\mu$m. The contact region 5 is then implanted via the edge of the first polysilicon 8 with a subsequent short annealing step, which ensures that the source layer 5 is terminated below the first polysilicon layer 8.

The second end of the channel 7 is thus defined very precisely by the width of the spacer 12, and its length can be defined at 0.5 $\mu$m.

The insulator material applied for the purpose of fabricating the spacer 12, that is to say, in particular, an oxide, preferably serves, at the same time, as a covering insulator layer 7 for isolating the first (gate) semiconductor layer 8 from the subsequently applied metallization layer 16 for the contact-making of the source region 5.

The contact hole 15 to the contact region 5 can be fabricated by alignment. For this purpose, in a first preferred embodiment of the method, a further thin oxide layer 18 (approximately 0.2 $\mu$m) is deposited. Known trench etching is used to open the source layer and establish contact with the well 4 situated underneath. The contact implantation and the annealing thereof can be performed using customary DMOS technology.

FIG. 1 shows the semiconductor after the contact hole 15 has been opened, therefore the residual layer 6 and the intermediate insulator layer 10 are only partly present. In this case, the spacer 12 serves as an etching mask for the first semiconductor layer 8 and the gate insulator layer 2, the etching being followed by n$^+$-type ion implantation.

Figure 2:
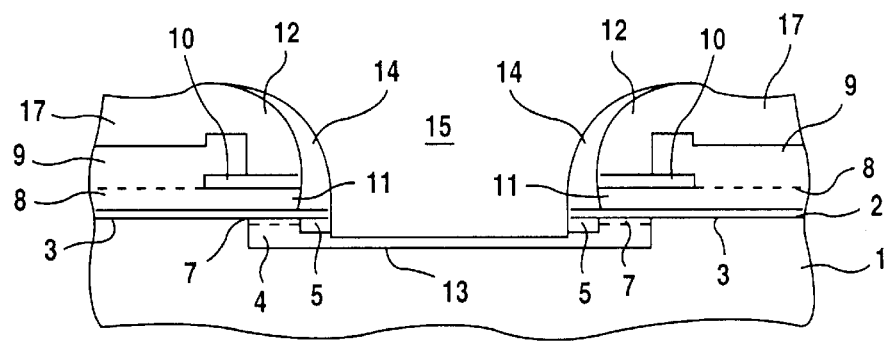
FIG. 2 is a fragmented, sectional view of a further embodiment of the semiconductor component.

FIG. 2 illustrates the semiconductor structure fabricated according to a further embodiment of the method according to the invention. In this case, the same regions as in FIG. 1 are identified by identical reference symbols. In this embodiment, the contact hole 15 is also fabricated in a self-aligned manner: after the implantation of the source zone 5, a second spacer 14 is produced, which ensures insulation between the subsequent metallization layer 16 in the contact hole 15 and the first semiconductor layer 8. The trench etching and contact-making then ensue in the manner described for the first embodiment of the method according to the invention with reference to FIG. 1.

By virtue of the second spacer 14, a spacing between the polysilicon layer 11 and the contact hole is less than 0.5 $\mu$m, as a result of which the spacing from the contact hole 15 up to the end of the channel at the drain is reduced to below 1 $\mu$m.

The principle underlying the invention consists, in summarized form, in the fact that instead of the customary thickness of the polysilicon layer for the gate of approximately 0.5 $\mu$m, only the first polysilicon layer 8 having a thickness of approximately 0.1 $\mu$m is deposited (produced) on the gate oxide 2. The insulator layer 10 having a thickness of approximately 0.05 $\mu$m is produced on the first polysilicon layer by oxidation of the polysilicon layer 8 or by deposition. The insulator layer 10 is then opened by a (noncritical) photographic technique and the second polysilicon layer 9 is deposited in such a way that it makes contact with the first polysilicon layer 8 in the regions from which the oxide has been removed. A further oxide layer is deposited on the second polysilicon layer 9 in accordance with the known spacer technology and this oxide and the second polysilicon layer 9 situated underneath are thereupon structured by anisotropic etching. The etching stops at the thin oxide above the first polysilicone layer 8. There then ensues the p-type implantation for producing the p-type well 4 for the n-channel transistor through the first polysilicon layer 8 and the gate oxide 2, the second polysilicon layer 9 and the oxide layer situated above it serving (in the side regions) as an implantation barrier. The p-type well 4 produced in this way is not outdiffused, but rather only annealed by relatively low temperatures or by rapid thermal annealing. The penetration depth of the implanted p-type layer is thus considerably smaller than in the case of diffusion (DMOS); the resistance of the JFET is thus reduced.

The spacers 12, 14 are fabricated in a known manner.

The method can be applied to the fabrication of n-channel transistors and also to depletion-mode and p-channel transistors.

The method according to the invention enables the on resistance $R_{on}$ of the power transistor to be reduced once again by more than 25% in comparison with contemporary solutions, the additional costs for the fabrication process amounting to less than 10%.

The second polysilicon layer 9 is illustrated identically, i.e. with the same properties, in FIGS. 1 and 2. However, the doping of the second polysilicon layer 9 and the doping of the first polysilicon layer 8 may also be chosen to be different. Thus, it is possible to use different impurity atoms to dope the first semiconductor layer 8 from those used to dope the semiconductor layer 9. In addition, the two polysilicon layers 8 and 9 may be doped to different extents (high or low doping to give a $p^+$-type or $n^+$-type layer, respectively). As a result, it is possible to realize additional components in the polysilicon planes, thus e.g. zenner diodes in addition to a transistor fabricated by the method according to the invention, for controlling the transistor.

Incidentally, the method is followed by the customary steps for fabricating a semiconductor component, such as metallization of the surface with AlSi, opening of a window into the AlSi, passivation of the surface, metallization of the surface, etc., which are known to a person skilled in the art and are not explained here in any further detail.

We claim:

1. A method for fabricating a field effect-controllable semiconductor component, which comprises:

providing a semiconductor substrate of a first conductivity type having a surface;

producing a gate insulator layer on the surface of the semiconductor substrate;

producing a semiconductor layer having a first predetermined thickness on the gate insulator layer;

reducing the semiconductor layer in a predetermined region to obtain a residual layer having a second predetermined thickness; and producing a well of a second conductivity type in the semiconductor substrate by implanting impurity atoms with the semiconductor layer acting as an implantation barrier outside a predetermined region during the producing step of the well.

2. The method according to claim 1, which comprises: during the step of producing the semiconductor layer on the gate insulator layer, performing the steps of:

producing a first semiconductor layer on the gate insulator layer, the first semiconductor layer forming the residual layer in the predetermined region;

producing an intermediate insulator layer on at least a portion of the first semiconductor layer; and producing a second semiconductor layer on the intermediate insulator layer such that the second semiconductor layer is partly in contact with the first semiconductor layer.

3. The method according to claim 2, which comprises: producing a spacer functioning as a further implantation barrier on the residual layer; and producing a contact region of the first conductivity type in the well by implanting further impurity atoms, a spacing of the contact region from an edge of the well is predetermined by the spacer.

4. The method according to claim 3, which comprises producing a further spacer as an etching barrier on the semiconductor substrate such that a spacing of a contact hole from the edge of the well is predetermined, the further spacer being produced after the step of producing the contact region.

5. The method according to claim 1, which comprises setting an implantation depth of the well to be less than 1 $\mu$m.

6. The method according to claim 3, which comprises setting a width of the spacer for the spacing between the contact region and the edge of the well at approximately 0.5 $\mu$m.

7. The method according to claim 4, which comprises setting a width of the further spacer for the spacing between the contact hole and the edge of the well at less than 0.5 $\mu$m.

8. The method according to claim 1, which comprises setting a gate length to be less than 0.5 $\mu$m.

9. The method according to claim 2, which comprises doping the first semiconductor layer and the second semiconductor layer differently.

10. The method according to claim 1, which comprises performing an annealing process in a predetermined temperature range over a predetermined period of time.

* * * * *